United States Patent
Fenouillet-Beranger et al.

(10) Patent No.: US 9,852,950 B2
(45) Date of Patent: Dec. 26, 2017

(54) SUPERIMPOSED TRANSISTORS WITH AUTO-ALIGNED ACTIVE ZONE OF THE UPPER TRANSISTOR

(71) Applicant: Commissariat A L'Energie Atomique et aux Energies Alternatives, Paris (FR)

(72) Inventors: Claire Fenouillet-Beranger, Voiron (FR); Philippe Coronel, Barraux (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/184,076

(22) Filed: Jun. 16, 2016

(65) Prior Publication Data

US 2016/0372375 A1    Dec. 22, 2016

(30) Foreign Application Priority Data

Jun. 18, 2015   (FR) ..................... 15 55591

(51) Int. Cl.
*H01L 23/535* (2006.01)
*H01L 27/06* (2006.01)
*H01L 21/768* (2006.01)
*H01L 21/822* (2006.01)
*H01L 21/8234* (2006.01)
*H01L 27/02* (2006.01)
(Continued)

(52) U.S. Cl.
CPC .... *H01L 21/8221* (2013.01); *H01L 21/76816* (2013.01); *H01L 21/76895* (2013.01); *H01L 21/823412* (2013.01); *H01L 21/823475* (2013.01); *H01L 23/5283* (2013.01); *H01L 23/535* (2013.01); *H01L 27/0207* (2013.01); *H01L 27/0688* (2013.01); *H01L 27/088* (2013.01)

(58) Field of Classification Search
None
See application file for complete search history.

(56) References Cited

U.S. PATENT DOCUMENTS 7,556,995 B2    7/2009 Coronel et al.
7,804,134 B2    9/2010 Coronel et al.
(Continued)

OTHER PUBLICATIONS

French Preliminary Search Report dated Apr. 6, 2016 in French Application 15 55591, filed on Jun. 18, 2015 ( with English translation of Categories of Cited Documents).

(Continued)

*Primary Examiner* — Seahvosh Nikmanesh
*Assistant Examiner* — Xiaoming Liu
(74) *Attorney, Agent, or Firm* — Oblon, McClelland, Maier & Neustadt, L.L.P.

(57) ABSTRACT

Integrated circuit equipped with at least two levels of superimposed transistors, comprising:
a first transistor at a first level,
a first plug, a second plug and a third plug, connected to a drain region, a gate and a source region respectively of the first transistor, the first plug, the second plug and the third plug passing through an insulating layer covering the first transistor
a second transistor equipped with an active zone defined in a semi-conducting layer arranged at one end of the plugs and facing the first transistor, the transistor comprising a gate arranged between the first plug and the third plug.

18 Claims, 12 Drawing Sheets

(51) Int. Cl.
*H01L 27/088* (2006.01)
*H01L 23/528* (2006.01)

(56) References Cited

U.S. PATENT DOCUMENTS

| | | | |
|---|---|---|---|
| 2002/0017689 A1* | 2/2002 | Hirano | H01L 21/76283 257/351 |
| 2005/0074699 A1* | 4/2005 | Sun | G03F 7/091 430/312 |
| 2006/0102959 A1 | 5/2006 | Kim et al. | |
| 2007/0197012 A1* | 8/2007 | Yang | H01L 21/76805 438/597 |
| 2007/0257322 A1 | 11/2007 | Shi et al. | |
| 2010/0099233 A1* | 4/2010 | Wacquez | H01L 21/76264 438/424 |
| 2010/0295136 A1 | 11/2010 | Or-Bach et al. | |
| 2012/0181510 A1* | 7/2012 | Avouris | H01L 27/0688 257/29 |
| 2013/0175505 A1* | 7/2013 | Sung | H01L 51/0541 257/29 |

OTHER PUBLICATIONS

U.S. Appl. No. 14/232,092, filed Apr. 3, 2014, 2015/0115769 A1, Guillaume Savelli et al.
U.S. Appl. No. 14/369,752, filed Jun. 30, 2014, 2014/0356528 A1, Olivier Dellea et al.
U.S. Appl. No. 14/375,532, filed Jul. 30, 2014, 2015/0010693 A2, Olivier Dellea et al.
U.S. Appl. No. 14/375,858, filed Jul. 31, 2014, 2014/0374930 A1, Olivier Dellea et al.
U.S. Appl. No. 14/398,340, filed Oct. 31, 2014, 2015/0084480 A1, Guillaume Savelli et al.
U.S. Appl. No. 14/001,088, filed Aug. 22, 2013, 2013/0330471 A1, Olivier Dellea et al.
U.S. Appl. No. 14/128,266, filed Feb. 25, 2014, 2014/0158334 A1, Olivier Dellea et al.
U.S. Appl. No. 14/131,082, filed Jan. 6, 2014, 2014/0147583 A1, Olivier Dellea et al.
U.S. Appl. No. 14/423,957, filed Feb. 25, 2015, 2015/0217328 A1, Olivier Dellea et al.
U.S. Appl. No. 14/892,473, filed Nov. 19, 2015, 2016/0094108 A1, Abdelkader Aliane et al.
U.S. Appl. No. 14/890,016, filed Nov. 9, 2015, Olivier Dellea et al.
U.S. Appl. No. 14/890,857, filed Nov. 12, 2015, 2016/0101432 A1, Olivier Dellea et al.
U.S. Appl. No. 14/887,831, filed Oct. 20, 2015, 2016/0111330 A1, Claire Feonouillet-Beranger et al.
U.S. Appl. No. 15/176,716, filed Jun. 8, 2016, Claire Fenouillet-Beranger et al.

* cited by examiner

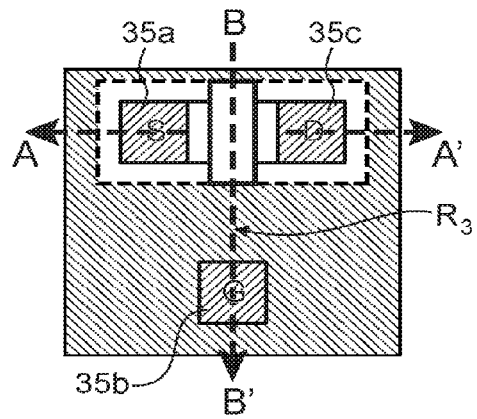
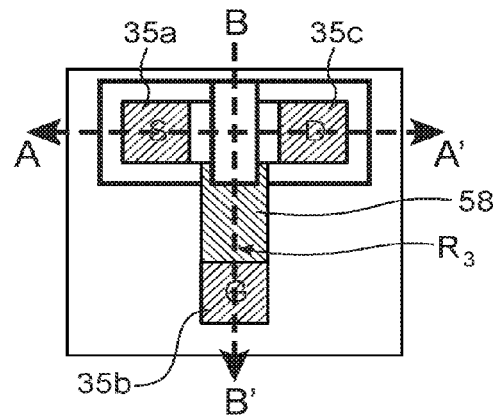
FIG.2D  FIG.2E
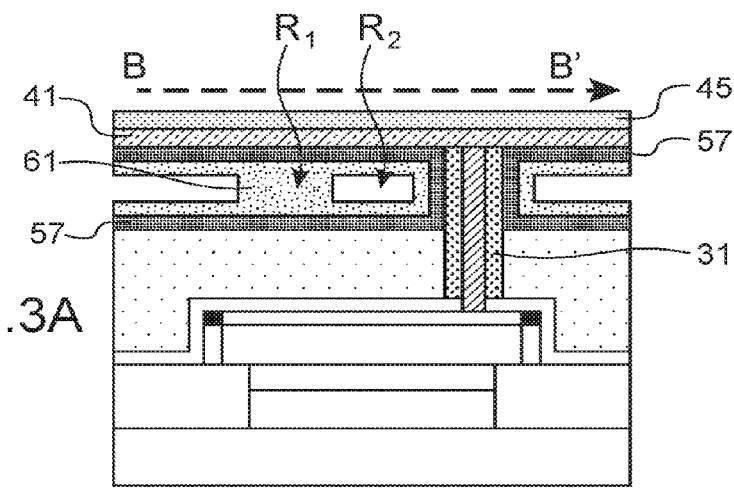
FIG.3A
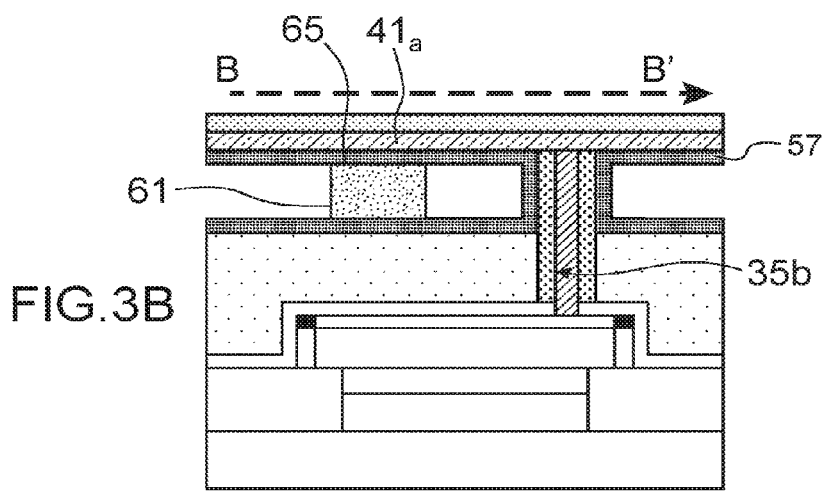
FIG.3B

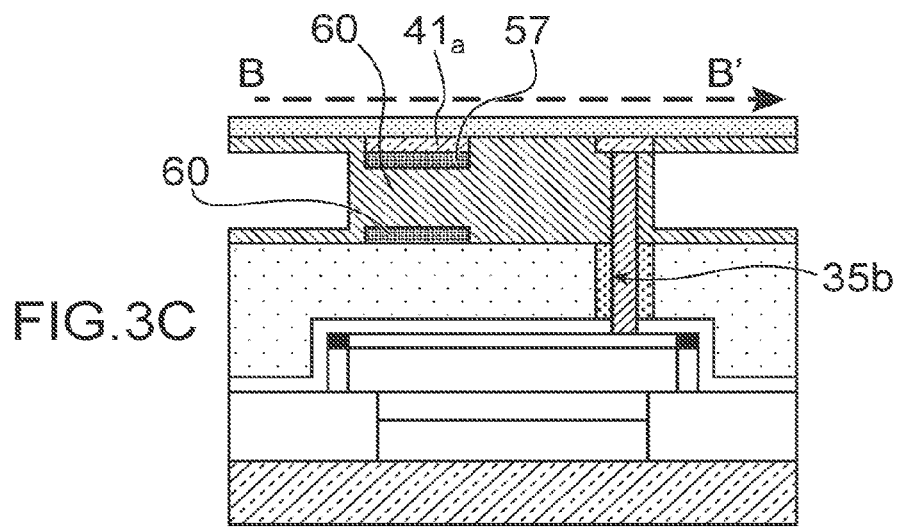
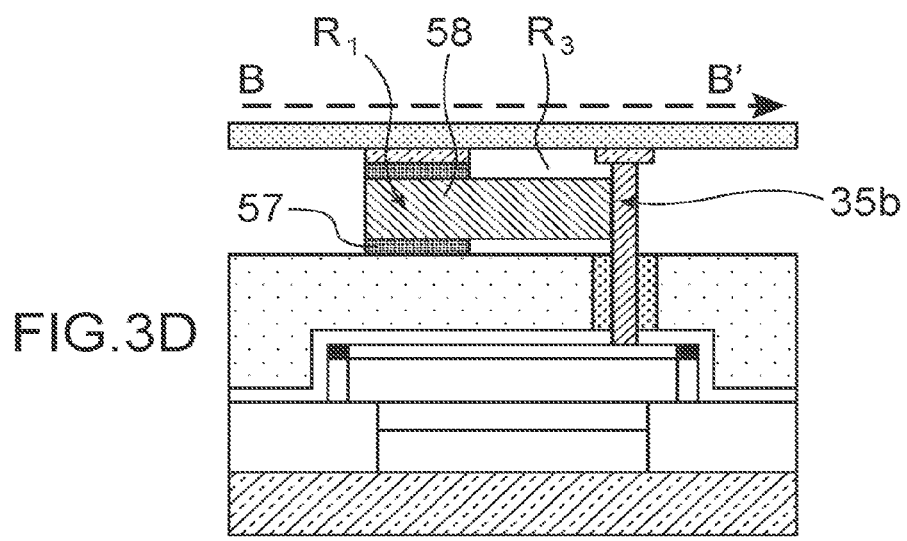
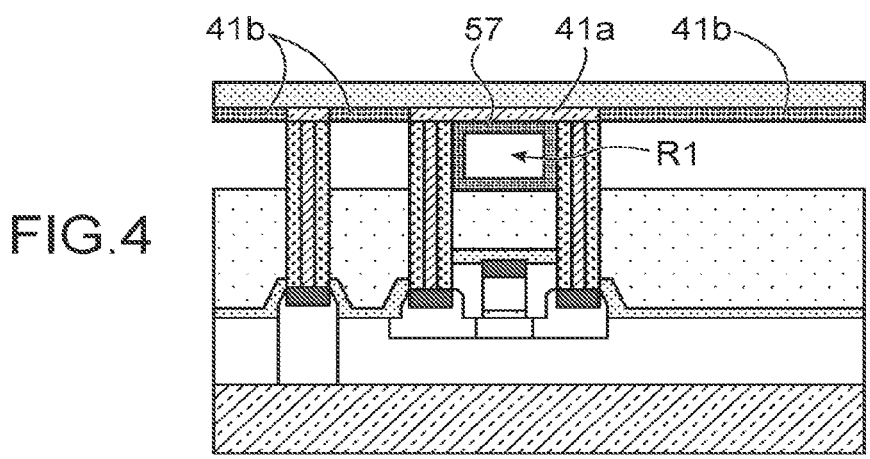

SUPERIMPOSED TRANSISTORS WITH AUTO-ALIGNED ACTIVE ZONE OF THE UPPER TRANSISTOR

TECHNICAL FIELD AND PRIOR ART

The present application relates to the field of microelectronics and more particularly to that of the fabrication of devices equipped with superimposed components, in particular of transistors with transistors distributed over several levels.

Such devices generally comprise a stack of at least two semi-conductor layers separated by an insulating layer. This type of device is referred to as a three-dimensional integrated circuit.

The manufacturing costs for such circuits can prove to be high, in particular because of the number of supplementary photolithography steps used to form the components in the upper level.

In addition, during such photolithography steps precise alignment between the various levels is difficult to achieve, which can constrain the designers of such device in terms of design specifications and result in a limited integration density of the components.

The problem arises of finding a new method for making an improved stacked transistors device to overcome the disadvantages mentioned above.

DESCRIPTION OF THE INVENTION

One embodiment of the present invention provides for a method for manufacturing an integrated circuit equipped with at least two levels of stacked transistors, which comprises steps for:
creating a plurality of plugs including a first plug, a second plug and a third plug, on a drain region, a gate and a source region respectively of a first transistor on a first level of transistor(s), the first plug, the second plug and the third plug passing through an insulating layer covering the first transistor and being arranged such that the first plug is spaced apart from the third plug by a distance of at least $d_2$, where the second plug is spaced apart from the first plug and from the third plug by a distance of at least $d_1$, where $d_1$ and $d_2$ are specified such that $d_1 > d_2$,
forming a semi-conducting layer suitable for receiving at least one channel region of a second transistor of a second level of transistor(s), where the semi-conducting layer is arranged at one end of the plugs at a height h such that $h > d_1$,
forming a protective block in a first region of a cavity made between the insulating layer and the semi-conducting layer, where the first region is located facing the first transistor between the first plug and the third plug, the formation of the protective block comprising steps for conforming deposition of sacrificial material in a cavity of height h formed between the semi-conducting layer and the insulating layer, then partial removal of the sacrificial material by isotropic etching in such a way as to preserve a block of sacrificial material between the first plug and the third plug at the end of the isotropic etching, where an active zone of the second transistor is suitable for being defined facing the first plug the third plug and the protective block.

Thus a transistor can be made at a higher level, with an active zone which is auto-aligned with the level below it without this requiring that a photolithography step be carried out.

In addition to allowing good alignment between the upper level and the lower level of transistors to be achieved, through the layout of the plugs such a method also increases integration density insofar as at least one plug acting as a connection plug is arranged facing both the first and the second transistor.

The method may in addition comprise at least one step for defining the active zone of the second transistor.

According to first option, the active zone may be defined using oxidation of the zones of the semi-conducting layer which are not protected by the protective block or by the plugs.

If it is wished to avoid using a significant thermal budget, the definition of the active zone of the second transistor may, in one variant, be made by etching zones in the semi-conducting layer which are not protected by the protective block or by the plugs.

The semi-conducting layer may be formed on a sacrificial support layer which thickness is equal to h, arranged on the insulating layer. In this case the method may in addition include prior to the formation of the protective block: the removal of the sacrificial layer so as to form the cavity.

The protective block may also be formed of a layer of gate dielectric deposited beforehand on the sacrificial material.

In this case the formation of the protective block may in addition comprise, after the deposition of the sacrificial material and isotropic etching of the sacrificial material, partial removal of the gate dielectric layer in the cavity, with the gate dielectric layer being preserved in the first region, the method furthermore comprising, after definition of the active zone, steps for:
removal of the sacrificial material in the first region and then,
formation of a gate material in the cavity by deposition in the cavity,
partial removal of the gate material in the cavity by isotropic etching so as to preserve the gate material in the first region.

One or more plugs may be formed of a conducting rod coated with an insulating envelope.

According to one option for implementation, the method may furthermore comprise removal of the sacrificial material and, prior to the formation of gate material in the cavity, a step for removal of a portion of the insulating envelope from the plugs, so as to expose a portion of conducting rod.

The gate material may be formed so as to fill in another region located between the first region and the second region. In this case the isotropic etching of the gate material may be made so as to partially remove the gate material, with the gate material being preserved in this other region.

Thus a connection zone may be formed between the gate of the upper level transistor and that of the transistor of lower level.

According to one implementation option, the method may furthermore include the formation of a fourth plug arranged in contact with a surface semi-conducting layer upon which the first transistor is formed.

In this case this fourth plug being located at least a distance $d_3$ from the first plug, from the second plug and from the third plug, such that $d_3 > d_1$. This ensures that certain materials can be correctly removed during the course of the method.

According to one implementation option, at least one given plug may be formed with a lower conducting portion connected to the first transistor and an upper portion extending from the lower portion, the upper portion being based on an insulating material and being configured so as to create insulation between the lower portion and the second transistor.

The upper portion of the given plug may serve to define the active zone of the second transistor $T_2$ without however connecting this active zone to the lower conducting portion which in turn may be connected to the first transistor $T_1$.

According to one implementation option, the given plug may be the third plug, that is, that connected to the source region of the first transistor. In this case the first transistor and the second transistor may have independent source regions.

Thus the first transistor and the second transistor may advantageously be arranged in such a way as to form an inverter.

The lower conducting portion may be formed of conducting zones forming an elbow. Such an arrangement may facilitate electrical contact being made over the region of the first transistor with which this lower portion is connected.

According to one implementation option at least one other plug comprises a lower conducting portion connected to the first transistor and an upper conducting portion connected to the lower portion and to the second transistor.

In this case a first method for forming the given plug and of the other plug may comprise steps for:
  formation of a layer and in this layer a first hole and a second hole, the first hole and the second hole exposing respectively a lower conducting portion of the other plug and the lower conducting portion of the given plug, the first hole having a first transverse cross section S1 greater than the second cross section S2 of the second hole,
  filling of the second hole using a filler material,
  formation of a conductive rod coated with an insulating envelope in the first hole,
  removal of the filler material in the second hole,
  formation of an insulating material in the second hole.

After formation of the conducting rod and of the insulating envelope in the first hole, and prior to the removal of the filler material in the second hole, the second hole is widened so that the second hole has a transverse cross-section which is equal or substantially equal to the first cross-section S1.

A second method for the formation of the given plug and of the other plug may comprise steps for:
  formation, on the lower respective conducting portions of the other plug and of the given plug, of an insulating layer then of a first hole and of a second hole in this insulating layer, the first and second hole exposing respectively the lower conducting portion of the other plug and the lower conducting portion of the given plug, the first hole having a first transverse cross-section S1, the second hole being formed of a part which has a second transverse cross-section S2<S1, opening out onto an end of cross-section equal or substantially equal to S1,
  deposition in the first hole and the second hole of an insulating material,
  etching of the insulating material so as to expose the bottom of the first hole whilst preserving an insulating envelope on the side walls of the first hole and an insulating zone at the bottom of the second hole,
  deposition of a conducting material.

According to another aspect, the present invention provides for an integrated circuit equipped with at least two levels of superimposed transistors, comprising:
  a first transistor of a first level,
  a plurality of plugs, including at least a first plug, a second plug, and a third plug connected to a drain region, a gate and a source region of the first transistor respectively, with the first plug, the second plug and the third plug passing through an insulating layer covering the first transistor.
  a second transistor of a second level equipped with an active zone defined in a semi-conducting layer arranged facing the first transistor at one end of the first plug, and of the third plug, with the transistor comprising a gate which comprises a first portion arranged between the first plug and the third plug.

This gate may also comprise a second portion arranged between the first portion and the second plug.

BRIEF DESCRIPTION OF THE ILLUSTRATIONS

The present invention will be better understood on reading the description of embodiment examples, which are given for purely illustrative purposes and which are in no way limiting, whilst referring to the appended drawings in which:

FIGS. 1A-1N, 2A-2E, 3A-3D serve to illustrate an example of a method for manufacturing a 3D integrated circuit wherein the active zone of an upper level transistor is defined using connection plugs of a lower level transistor;

FIG. 4 shows a variant of definition of the active zone by oxidation;

Identical, similar or equivalent portions of the various figures have the same numerical references, to facilitate movement from one figure to another.

The various portions shown in the figures are not necessarily shown at a uniform scale, in order to make the figures more readable.

Furthermore, in the following description, terms that depend on the orientation such as "on", "at the bottom", "upper", "lower", "lateral", "vertical", "horizontal" apply by considering a structure orientated in the manner shown in the figures.

DETAILED DESCRIPTION OF PARTICULAR EMBODIMENTS

An example of a method for manufacturing a microelectronic device equipped with components distributed over several levels will now be given in association with FIGS. 1A-1N, 2A-2E, 3A-3D, which respectively give a first transverse cross-section view, top views and views along a second transverse cross-section of the device during manufacture.

Figure 1A:
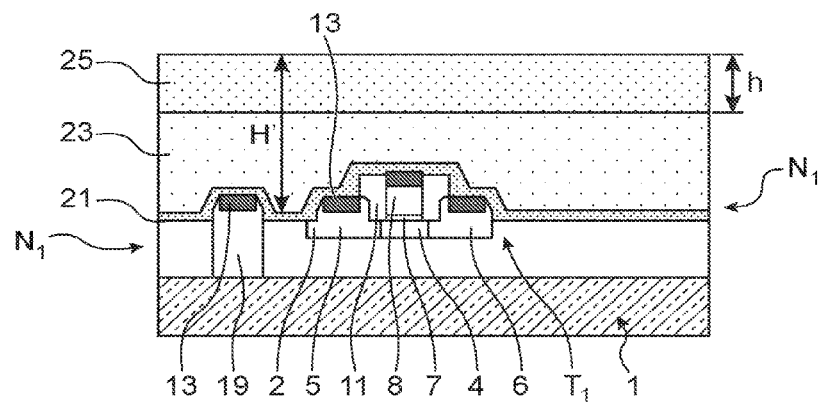

The device may be formed, for example, from a first support 1 which may be in the form of a semi-conductor type substrate on insulation or "Bulk" substrate type comprising a semi-conducting surface layer 2 wherein a channel region of at least one transistor $T_1$ belonging to a first level $N_1$ of a stack of electronic components distributed over several layers is provided. Such a transistor $T_1$ is illustrated in FIG. 1A.

The manufacture of the first transistor $T_1$ comprises the formation of a gate dielectric 7, of a gate 8 on the gate dielectric zone as well as source 6 and drain 5 regions on either side of the channel region 4. Insulator spacers 11 may also be made on either side of the gate 8. Source 6, drain 5 and gate 8 regions may be topped or equipped with metal alloy and semi-conductor zones 13 commonly called silicided zones forming contacts. An additional silicided zone made directly on a zone 19 of the surface semi-conducting surface layer provided to form a contact with a ground plane may be provided for.

The transistor $T_1$ is then covered with one or more layers of dielectric material, for example with a stack of at least one layer 21 of silicon nitride coated with a layer 23 of silicon oxide that can be smoothed for example by CMP (chemical-mechanical planarization).

A sacrificial layer 25 is then formed on the insulating layer 23.

The base material of this sacrificial layer 25 is a material that is capable of being selectively etched relative to that of the insulating layer 23. The sacrificial layer material 25 may be for example poly silicon or SiCBN or a "low-k" type dielectric such as porous SiOCH. This sacrificial layer 25 is provided with a thickness h of between 80 nm and 100 nm for example, whereas the cumulative thickness H' of the sacrificial layer 25 and of the insulating layer 23 may be for example of the order of 120 nm.

Then connection plugs 35a, 35b, 35c, 35d are then made on the drain region 5, gate 8, source region 6, and ground plane zone 19 respectively.

To do this first of all holes 27a, 27b, 27c, 27d are formed in the stack of sacrificial layers 25 and insulating layers 23, 21, where the holes 27a, 27b, 27c, 27d respectively expose a drain contact zone, a gate contact zone, a source contact zone and the contact on the ground plane.

Figure 1B:
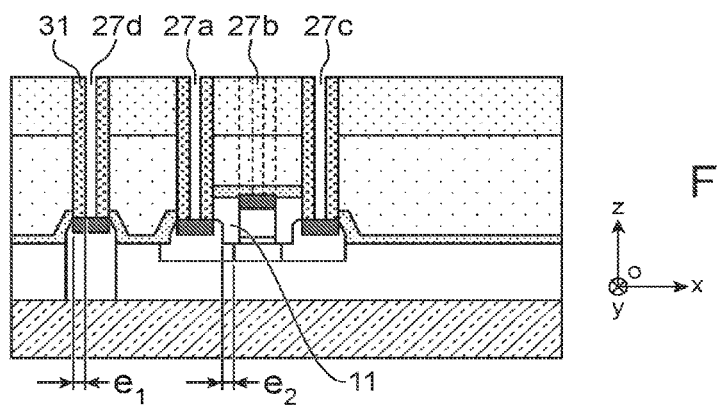

Then the walls and the bottom of the holes are covered by an insulating material 31, whilst preserving a central zone of holes 27a, 27b, 27c, 27d not filled by the insulating material 31 (FIG. 1B). The insulating material 31 for this could be formed by conforming deposition in the holes 27a, 27b, 27c, 27d then removed from the bottom of the holes 27a, 27b, 27c, 27d by anisotropic etching. The insulating material 31 is preferably different to that of the sacrificial layer 25. The insulating material may be for example silicon nitride or SiCBN or SiOCN.

Figure 1C:
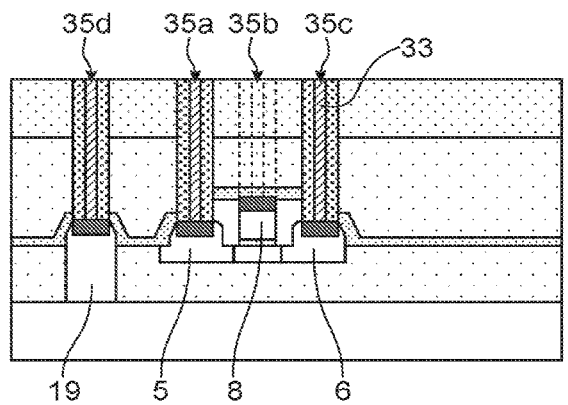

Then the central zone of the holes 27a, 27b, 27c, 27d is filled with a conducting material 33 such as, for example, tungsten. The plugs 35a, 35b, 35c, 35d thus formed comprise a rod of conducting material 33 whose sides are coated by an envelope based on insulating material 31. The thickness $e_1$ of the insulating envelope can be specified as a function of the size of the spacers 11, advantageously such that the thickness of the envelope 31 is less than the thickness $e_2$ of the spacers 11 (FIG. 1C).

Figure 2A:
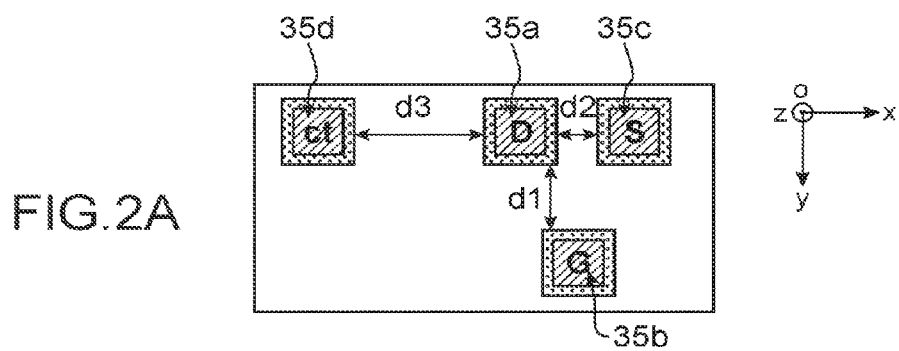

As is illustrated in FIG. 2A which gives a top view of the plugs, the arrangement of these plugs is planned such that the first plug 35a and the third 35c respectively connecting the drain region 5 and the source region 6 are spaced apart from each other by a distance of at least $d_2$ less than the thickness h of the sacrificial layer 25.

The second connection plug 35b of the gate 8 is spaced apart from drain plugs 35a and 35c the source plug by least a distance $d_1$ less than the thickness h of the sacrificial layer 25, where the distance $d_1$ is furthermore such that $d_1 > d_2$.

Such an arrangement of the plugs 35a, 35b and 35c is planned to allow subsequent definition of an active zone and a gate location for an upper level transistor, without necessarily having to carry out a specific photolithography step in order to do this. In the event that a contact plug 35d is made in the ground plane, this is spaced apart from the other plugs 35a, 35b, 35c by at least a distance $d_3$ such that $d_3 > d_1$.

Figure 1D:
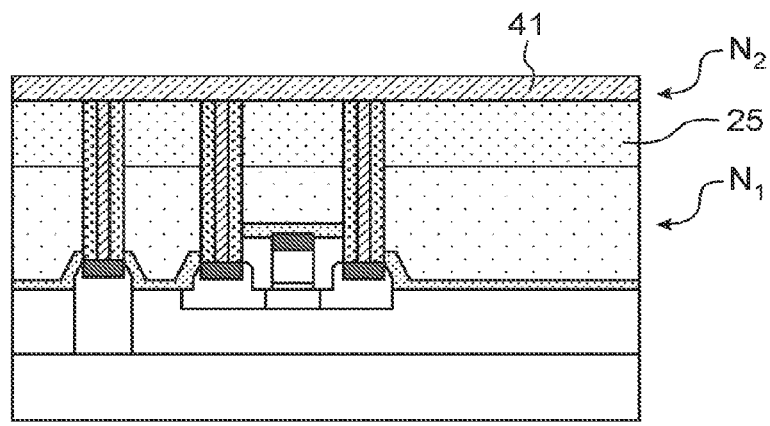

Then a sacrificial layer 25 is formed and at the top of the plugs 35a, 35b, 35c, 35d a semi-conducting layer 41 is made wherein a channel region of at least one second transistor of a second level $N_2$ of components is intended to be made (FIG. 1D).

This semi-conductor layer 41 may be formed by the addition of a substrate, for example by molecular bonding, then if necessary 'grinding' of a thickness of the substrate so as to preserve only the semi-conducting layer 41. This semi-conducting layer 41 is in contact with an upper end of the plugs 35a, 35b, 35c, 35d. The semi-conducting layer 41 may be based on a crystalline semi-conductor material, for example monocrystalline silicon or SiGe and may have a thickness of between for example 5 nm and 20 nm.

A masking layer 45 is then formed on the semi-conducting layer 41. The masking layer 45 is thus arranged on an upper face of the semi-conducting layer 41, that is, a face opposite that with which the plugs 35a, 35b, 35c, 35d are in contact. The masking layer 45 is intended to protect the semi-conducting layer 41. The material of the masking layer may be selected depending on the dielectric material 31 and the sacrificial layer 25 material. For example, a masking layer 45 based on silicon nitride or PolySiGe can be envisaged.

Figure 1E:
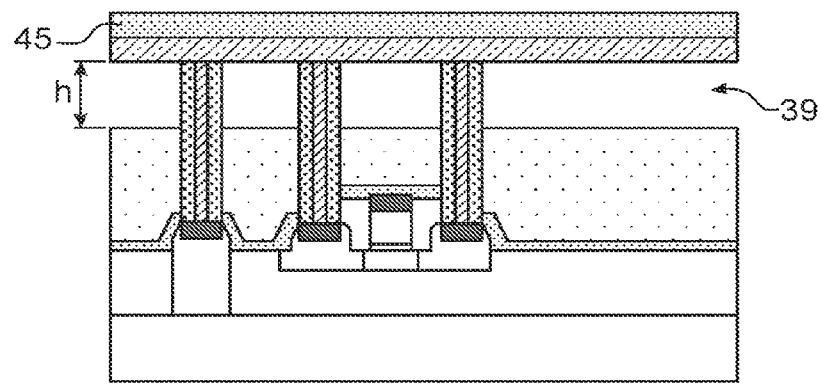

Then the sacrificial layer 25 is removed by selective etching in order to form a cavity 39 between the insulating layer 23 and the semi-conducting layer 41. The cavity 39 thus made exposes an upper portion of the plugs 35a, 35b, 35c, 35d (FIG. 1E).

In the case of the sacrificial layer 25 being based on polysilicon, this etching can be performed for example using $SF_6$ whereas when this sacrificial layer 25 is based on SiCBN this etching may be carried out using for example $Ar/CF_4/CH_3F/N_2$. A sacrificial layer 25 based on a low-k material of porous SiOCH type may be removed for example using a $CHF_3$ plasma.

The cavity 39 thus created has a height equal to the height h of the removed sacrificial layer 25. This semi-conducting layer 41 is then supported by plugs 35a, 35b, 35c, 35d.

Then a layer of gate dielectric layer 57 is formed in the cavity 39. This deposit is preferentially a conforming deposit made, for example, using a CVD (Chemical Vapor Deposition) or ALCVD (Atomic layer Vapor Deposition) technique.

Figure 1F:
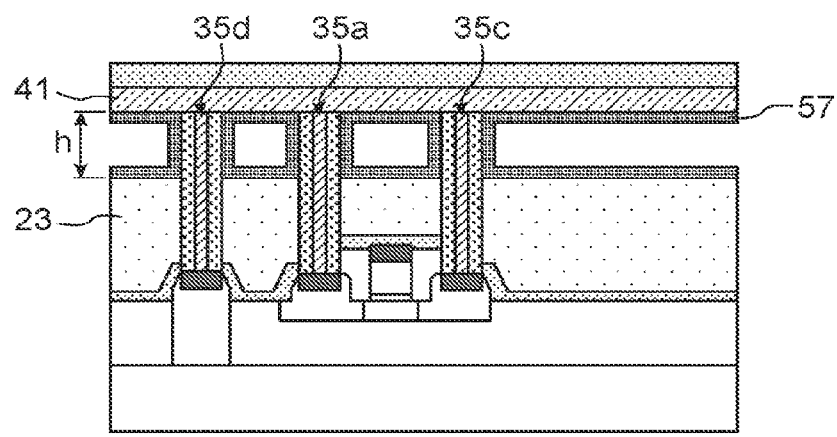

Such a deposition technique is used to coat the plugs 35a, 35b, 35c, 35d, with the semi-conducting layer 41 and the insulating layer 23 of a dielectric material 57 having a constant controlled thickness. The gate dielectric 57 is for example a "high-k" type material such as $HfO_2$ (FIG. 1F).

A protective block is then formed to define an active zone of the transistor of the second level $N_2$. To do this a sacrificial material 61 is deposited, preferably in a conforming manner, in the cavity 39. The sacrificial material 61 may be for example a material chosen in particular for selective etching relative to the gate dielectric 57 such as a nitrided silicon oxide or polySiGe.

The thickness of the sacrificial material 61 to be deposited is specified as a function of the separation between the first plug 35a connected to the source region 5 and the third plug 35c connected to the drain region 6 of the transistor T1 of lower level $N_1$ and so as to completely fill a first region $R_1$ of the cavity 39 located between the first plug 35a and the third plug 35c.

Figure 1G:
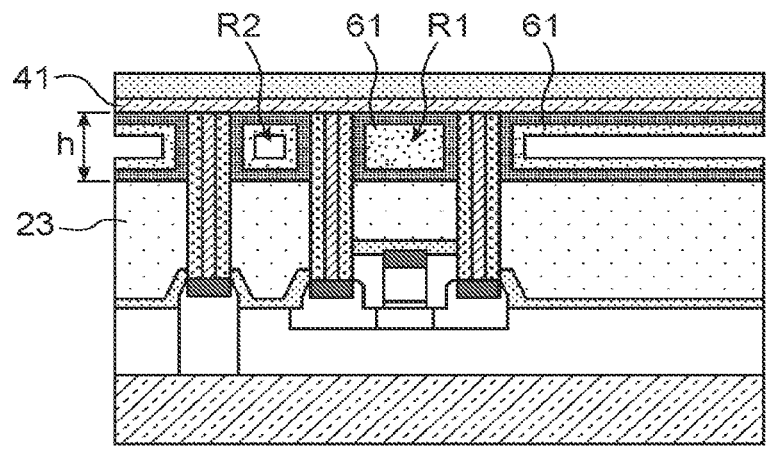
Figures 2B, 2C:
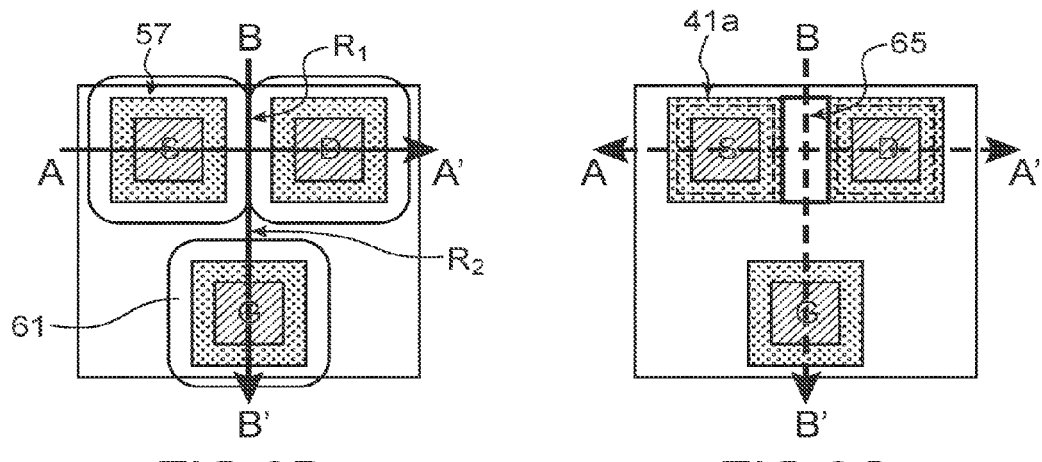

An example of sacrificial material 61 deposition is shown in FIGS. 1G, 2B and 3A, in which the device being manufactured is shown respectively in a transverse cross-section view, a top view and another transverse cross-section view BB'. In this example the thickness of the sacrificial material 61 is such that a second region $R_2$ of the cavity 39 located between the second plug 35b which is connected to the gate 8 of the transistor $T_1$ and the other plugs 35a, 35c is only partly filled.

Isotropic etching of the sacrificial material 61 is then carried out. As a result of the layout of the plugs 35a, 35b, 35c, 35d and of the quantity of sacrificial material 61 deposited, this etching can be used to remove the given material 61 from the cavity 39 except for the region $R_1$ located between the first plug 35a and the third plug 35c which are connected to the drain region and the source region respectively of the first transistor $T_1$. The isotropic etching is thus carried out such that the region $R_1$ remains entirely filled with the given material 61.

Thus a protective block 65 is defined, formed of the gate dielectric 57 and of the sacrificial material 61 in the first region $R_1$ of the cavity 39 located facing the first transistor $T_1$ and between the first plug 35a and the third plug 35c. Thus the boundary of the location or impression of a future active zone of an upper level transistor is marked out.

Figure 1H:
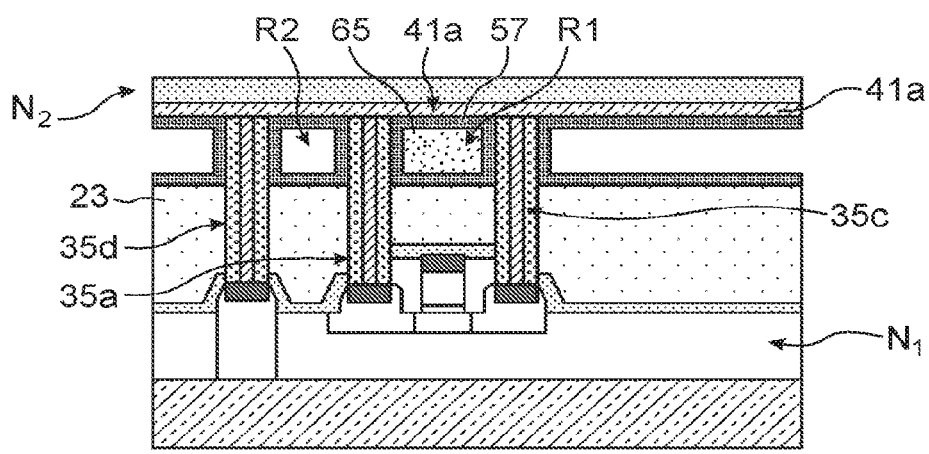
Figure 1I:
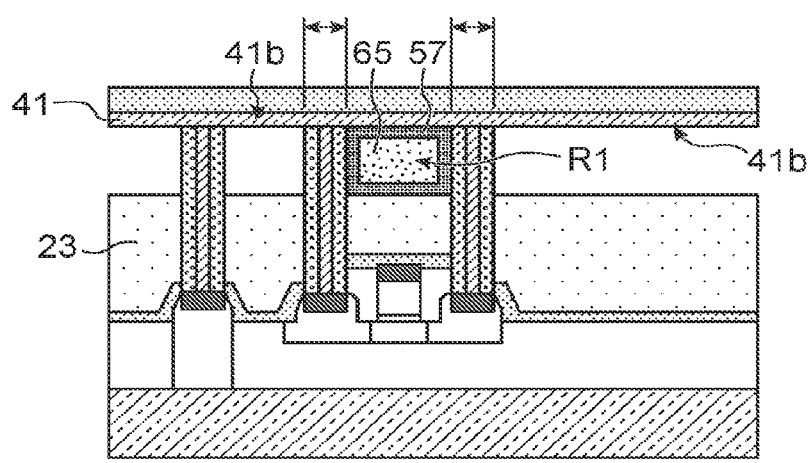

Indeed, a zone 41a of the semi-conductor layer 41 located facing the first plug 35a and the third plug 35c and the protective block 65 and which is protected by this block 65 and these plugs 35a, 35c is intended to constitute this active zone 41a (FIGS. 1H, 2C and 3B, in which the device being manufactured is shown respectively in transverse cross-section view, a top view and another transverse cross-section view BB').

A partial removal of the gate dielectric 57 in the cavity 39 is then carried out, with this dielectric 57 being preserved in the first region $R_1$ of the cavity 39 located between the first plug 35a and the third plug 35c. In a case where the gate dielectric 57 is based on $HfO_2$, this removal can be carried out for example using dry isotropic etching (FIG. 1).

Then an active zone 41a of the second transistor of the upper level $N_2$ is defined by modifying or removing parts of the semi-conducting layer 41 which are protected neither by the protective block 65 nor by the first plugs 35a and the third plug 35c. The dimensions of the active zone 41a depend on those of the first plug 35a, of the third plug 35c and of the protective block 65.

As shown in FIG. 4, according to one embodiment the active zone 41a can be defined by oxidation of parts 41b of the semi-conducting layer 41 which are not located facing the protective block 65 and which are protected neither by the protective block 65 nor by plugs 35a, 35b. In this case, the presence of the masking layer 45 prevents oxidation by the upper face of the semi-conducting layer 41 and thus protects the active zone 41a.

In this case the protective block 65 forms a mask against oxidation.

Thus non-protected parts 41b of the semi-conducting layer 41 are transformed into insulating zones. The remaining zone 41a located facing the protective block 65 or plugs 35a, 35b is not oxidized and is capable of forming the active zone 41a of the upper level transistor.

In order to limit the thermal budget used it may be preferred to define the active zone by etching, as a variant of this oxidation step.

Figure 1J:
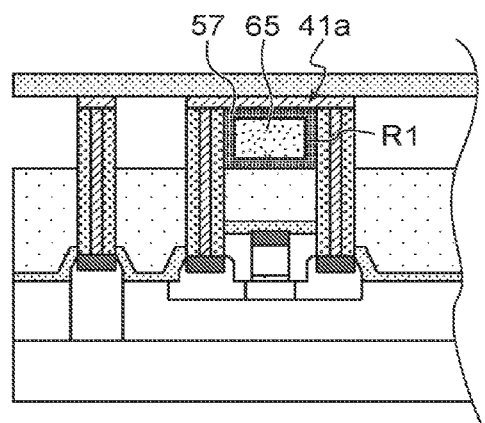

Such an embodiment variant is shown in FIG. 1J. The boundary of the active zone 41a of the second transistor is therefore marked out by etching the parts 41b of the semi-conducting layer 41 which are located facing the protective block 65 and which are protected neither by the protective block 65 nor by the contact plugs 35a, 35c for the drain zone and source zone respectively of the lower level transistor $T_1$. The remaining zone 41a located facing the protective block 65 or protected by the plugs 35a, 35b is preserved intact and is capable of forming the active zone 41a of the upper level transistor. In this variant the protective block 65 forms a mask against etching. For example, isotropic etching using $SF_6$ can be carried out when it is envisaged that the protective block 65 be based on a dielectric material or polySiGe.

Figure 1K:
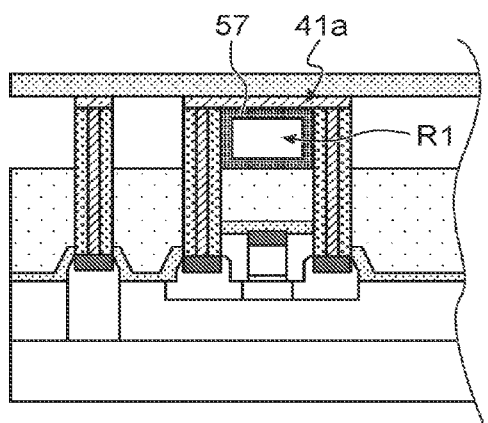

The sacrificial material 61 is then removed from the region $R_1$ located between plugs 35a and 35c (FIG. 1K). In a case where the sacrificial material 61 is, for example, based on a nitrided oxide, the etching may be carried out using a plasma based on carbon tetrafluoride ($CF_4$) or octafluorobutane ($C_4F_8$), or trifluoromethane ($CHF_3$) and oxygen. When the sacrificial material 61 is based on polySiGe etching using $SF_6$ can be carried out.

Figure 1L:
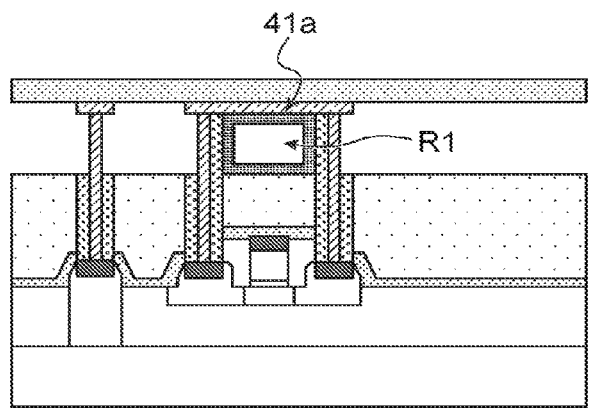
Figure 1M:
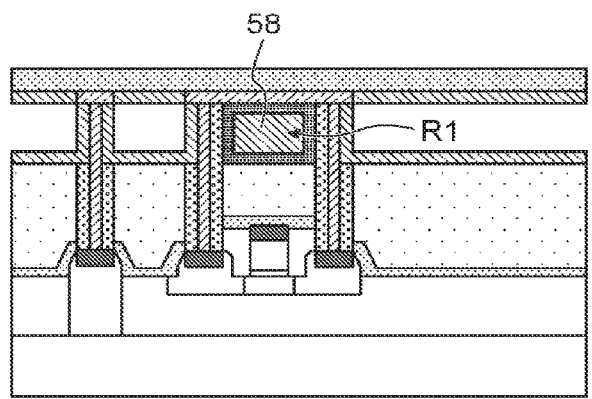

Then removal is carried out of a portion of the insulating envelope 31 around plugs 35a, 35b, 35c, 35d which is located in the cavity 39 and is not protected by the gate dielectric 57. Thus the conducting rod 33 is exposed at the portions of the plugs 35a, 35b, 35c, 35d located in the cavity 39 (FIG. 1L). In the case for example where the insulating envelope 31 is based on silicon nitride, this removal may be carried out for example using $CH_3F$. When the insulating envelope 31 is based on SiOCN the removal is achieved using for example $CH F_3$ or $C_2F_8$, mixed with a neutral gas such as Ar, or $N_2$. The gate material 58 is then deposited in the cavity 39 (FIGS. 1M, 2D and 3C).

The deposition of the gate material 58 is preferably carried out so as to fill the region $R_1$ between the first plug 35a and the third plug 35c, as well as another region $R_3$ located between the second plug 35b and the region $R_1$. The gate material 58 may be based for example on polysilicon or WSix or TiN deposited by CVD.

Figure 1N:
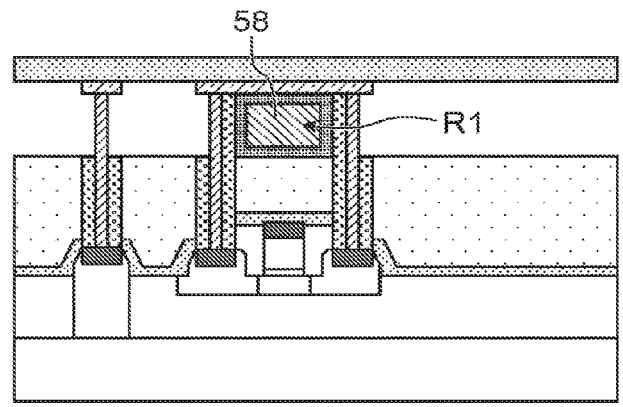

Isotropic etching of the gate material 58 is then carried out so as to preserve this material 58 in the region $R_1$ located between the plugs 35a and 35c and facing the first transistor $T_1$ (FIGS. 1N, 2E and 3D).

As a result of the separation between the plugs and in particular between the second connecting plug 35b relative to the first plug 35a and third plug 35c, material 58 is preserved in the other region $R_3$ of the cavity 39 which is located between the second connecting plug 35b and the region $R_1$.

In this way a gate for the second transistor $T_2$ is made in the region $R_1$ between the connection plugs 35a and 35c, whilst in the other region $R_3$ a connection zone 60 is formed between the gate of the second transistor $T_2$ and the second connection plug 35b.

The cavity 39 can then be filled in once more and source and drain semi-conducting regions then formed for the transistor $T_2$ of the second level $N_2$. Then contact plugs for these source and drain regions are made.

U.S. Pat. No. 7,556,995 B2 gives an example of the creation of source and drain regions and of contact plugs. The masking layer 45 is then removed.

One variant of the method that has just been described provides for the use of a plug placed in electrical contact with the drain region of the transistor $T_1$ or with the source region of this transistor $T_1$ of lower level $N_1$ equipped with an upper so-called "dummy" portion which is in contact with the second transistor $T_2$ but configured so as to prevent electrical connection with transistor $T_2$ of upper level $N_2$. The upper "dummy" portion then serves only to define the impression of the active zone 41a.

Figure 5:
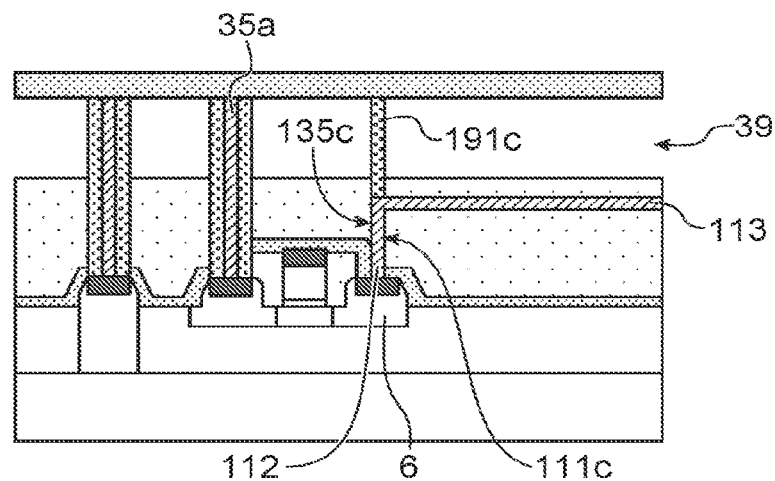
FIG. 5 shows an embodiment example of a 3D integrated circuit wherein the active zone of an upper level transistor is defined using plugs arranged on a lower level transistor, where at least one plug is equipped with an insulating upper dummy portion.

FIG. 5 shows an embodiment example of such a variant wherein a plug 135c formed in the source region 6 of the transistor comprises a lower portion 111c which is conducting and connected to the source region 6 and an upper portion 191c configured so as to create insulation between the semi-conducting layer 41 and the lower portion 111c of the conducting plug 135c, itself connected to the source region 6 of the transistor $T_1$ of lower level $N_1$. In this example, the upper portion 191c is formed of dielectric material or comprises a zone of dielectric material arranged so as to insulate the semi-conducting layer of the source region 6 of the transistor $T_1$ of the first level $N_1$.

The lower conducting portion 111c may be equipped with a first zone 112 in contact with the source 6 of the transistor $T_1$ and which extends in a first direction, here vertical and parallel to that of the other plugs 35a, 35d and a second zone 113 which extends in a second direction, here horizontal and parallel with the semi-conducting layer 41. The first zone 112 and the second zone 113 thus form an elbow or an L. One such variant of the layout of plugs can serve in particular for use as an inverter.

Figure 6A:
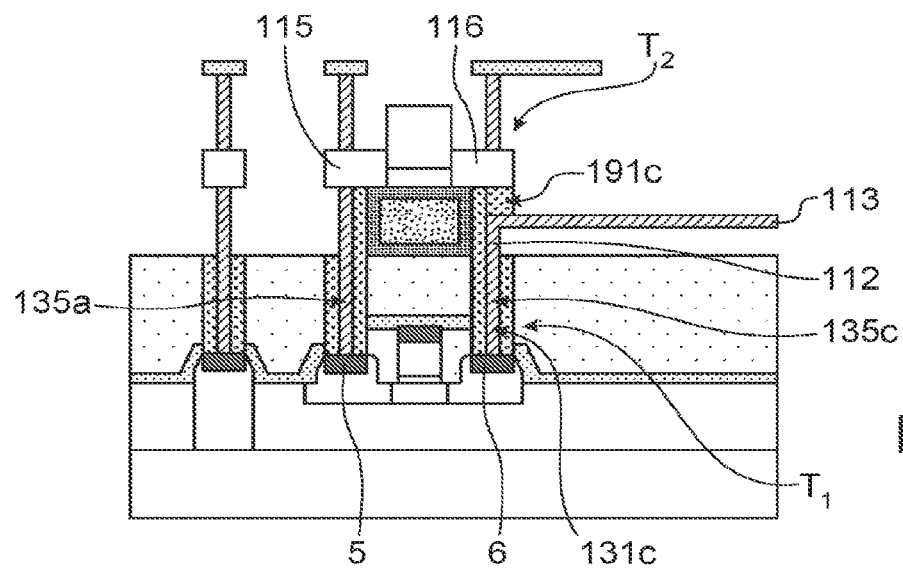
FIGS. 6A-6B show an embodiment example of an inverter formed of stacked transistors.
Figure 6B:
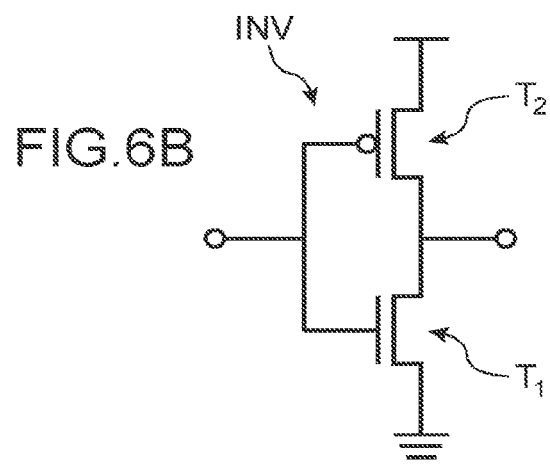

An embodiment example of such an inverter INV is shown in FIGS. 6A-6b formed of transistors $T_1$ and $T_2$. Superimposed transistors $T_1$ and $1_2$ are thus arranged such that the drain region 5 of the transistor $T_1$ of the first level $N_1$ is connected to a drain region 115 of the transistor of the second level $N_2$, by means of the first plug 35a. The respective source regions 6, 116 of the transistor $T_1$ of the first level $N_1$ and of the transistor $T_2$ of the second level $N_2$, are not connected together as a result of the specific configuration of the third plug 135c. This plug 135c comprises a lower portion 131c connected to the source region 6 of the first transistor $T_1$ and an upper portion 191c configured so as insulate the source region 116 of the transistor $T_2$ of upper level $N_2$ from the source region 6 of the transistor $T_1$ of lower level $N_1$.

In order to make a superimposed transistor device in which the boundary of an active zone of a transistor of an upper level is marked out using plugs made on the lower level transistor whilst providing for at least one plug equipped with an upper dummy portion, then the manufacturing method for these plugs can be altered An example of such a manufacturing method will now be described in connection with FIGS. 7A-7G.

For the sake of simplicity only the creation of a plug 135a intended to be connected to the two transistors $T_1$, $T_2$ and of another plug 135c equipped with an insulating upper portion arranged facing the second transistor $T_2$ and whose lower conducting portion is connected to the first transistor $T_1$, is shown.

Figure 7A:
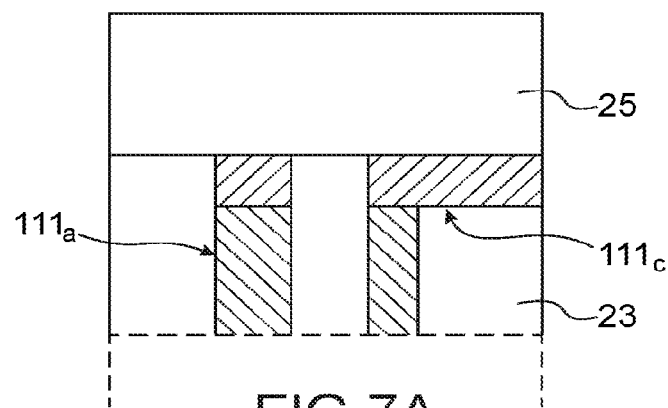
FIGS. 7A-7G show an embodiment example of connection plugs for a 3D circuit.

First of all lower conducting portions 111a, 111c of plugs 135a, 135c arranged respectively on the drain region and the source region of the transistor on the first level $N_1$ are made in insulating layer 23 (FIG. 7A).

Figure 7B:
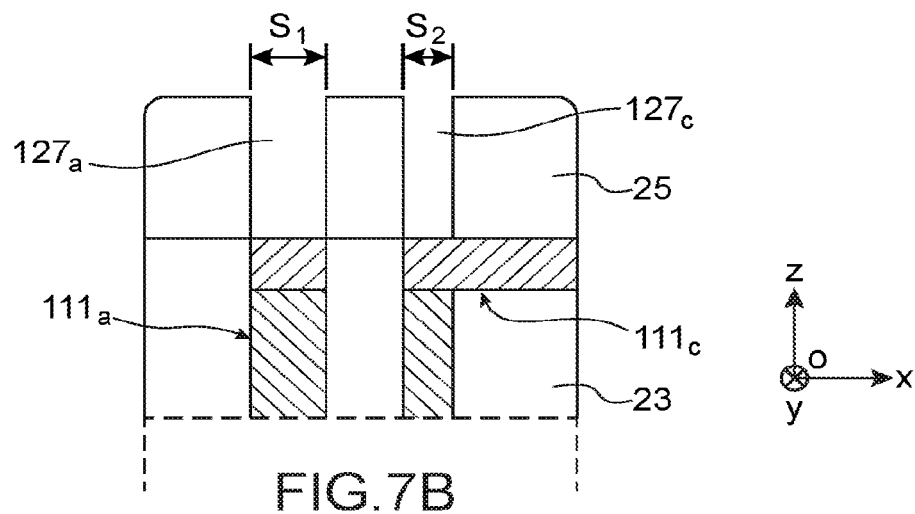

A layer, which may be the sacrificial layer 25, is then deposited in which a first hole 127a of transverse cross-section S1 is made, and a second hole 127c of transverse cross-section S2 is made, such that S2<S1. The term transverse cross-section of the holes refers to a section parallel to the plane [0; x; y] of the orthogonal index [0; x; y; z] given in FIG. 7B. The holes 127a, 127c respectively expose the lower conducting portions 111a, 111c of plugs 135a, 135c (FIG. 7B).

The second hole 127c is then blocked.

Figure 7C:
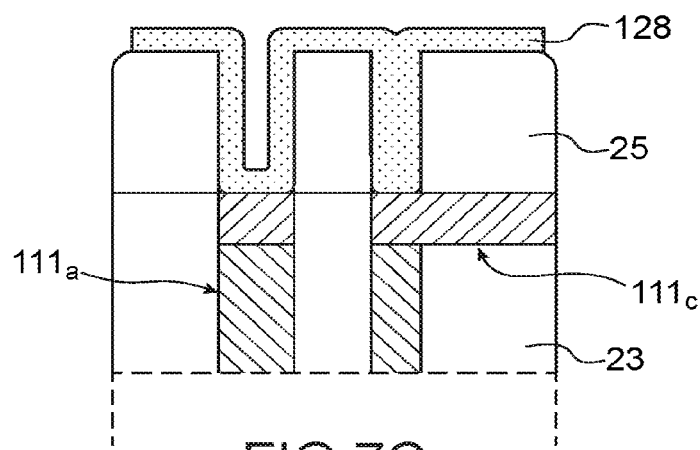

To do this a conforming deposit is made of a filler material 128, for example polySiGe or a dielectric material such as an oxide of TEOS type, so as to fill in the second hole 127c of smaller cross section S2 (FIG. 7C).

Figure 7D:
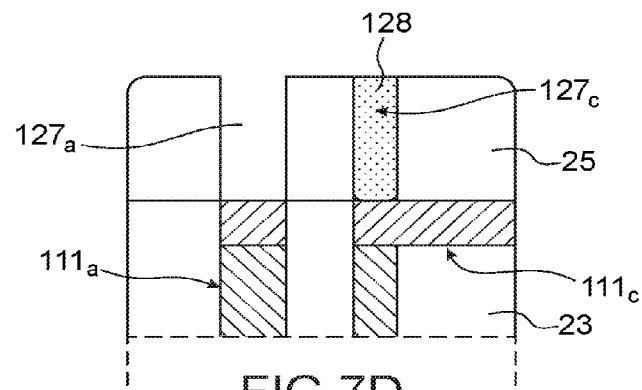

Then isotropic etching of the filler material 128 is carried out so as to remove the first hole 127a, where this material 128 is preserved in the second hole 127c (FIG. 7D).

Figure 7E:
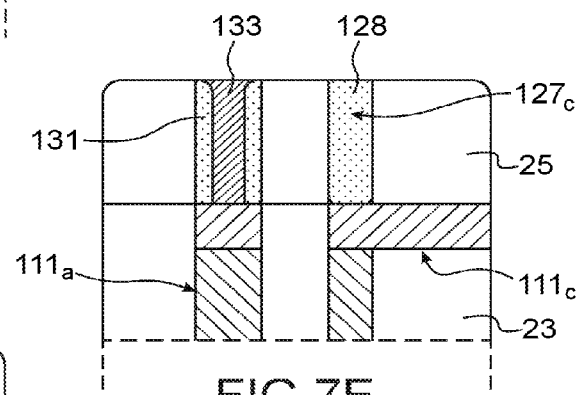

An envelope is then formed which is based on dielectric material 131, by conforming deposition on the walls and the bottom of the first hole 127a. The dielectric material 131 may be for example silicon nitride or a nitrided silicon oxide. Then this material 131 is removed from the bottom of the hole 127a by anisotropic etching. This hole 127a is then filled by a conducting material 133 such as, for example, tungsten (FIG. 7E).

Figure 7F:
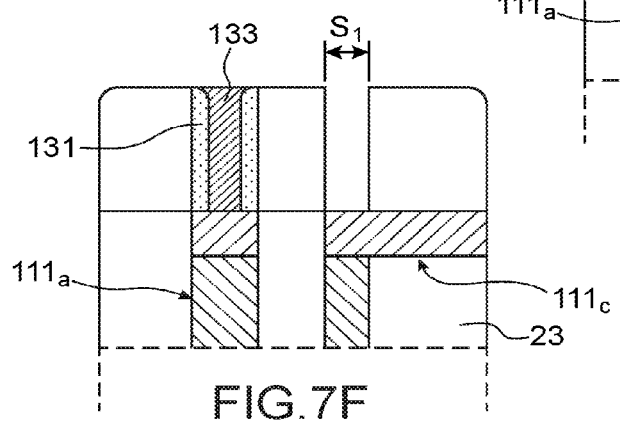

The second hole 127c is then emptied by etching of the material 128 using a hard mask (not shown). Then this hole 127 is widened for example using isotropic etching. This etching is carried out for a period of time chosen to give the second hole 127c a cross-section which is equal or substantially equal to that S1 of the first hole 127a (FIG. 7F). The term "substantially equal" here means differing by less than 4 nanometers.

This second hole 127c is then filled once more with a dielectric material 145.

Figure 7G:
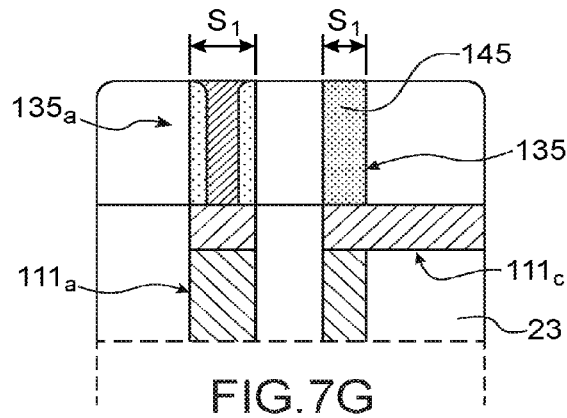

Thus in the second hole 127c an upper portion 191c of a plug 135c is obtained based on a dielectric material 121 and which is of cross-section equal to or substantially equal to that of the upper portion 191a of the plug 135a formed in the first hole. In the first hole 127a the upper portion 191a of the plug 135 is in turn formed from a rod of conducting material 133 coated with an insulating layer 131 (FIG. 7G).

Another example of a method for manufacturing plugs with at least one plug equipped with an upper dummy portion is shown in FIGS. 8A-8G.

First of all lower conducting portions 111a, 111c of plugs 135a, 135c are made in the insulating layer 23.

Then on the insulating layer 23 another insulating layer 223 is formed which is covered with a layer 224 of hard mask, which is itself then covered with a layer 225 of photosensitive resin in which a first hole 227a and a second hole 227c are formed.

Figure 8A:
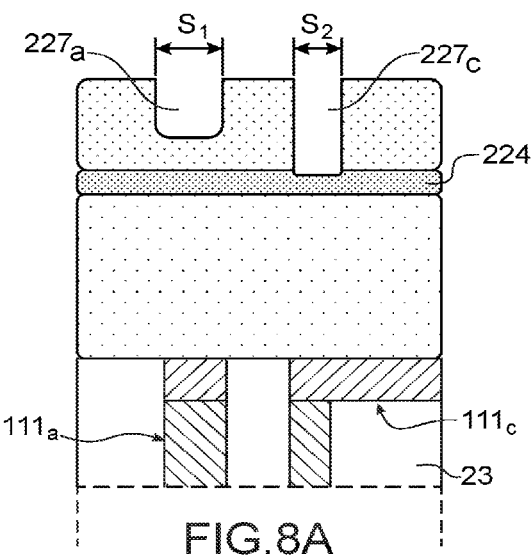
FIGS. 8A-8G show an embodiment example of connection plugs for a 3D circuit.

The first hole 227a and the second hole 227c have, respectively, a cross-section S1 and a cross-section S2, such that S2<S1. The first hole 227a and the second hole 227c also have, respectively, a first depth and a second depth, where the second depth is greater than the first depth and is designed such that the bottom of the second hole 227c exposes the layer 224 of hard mask (FIG. 8A).

Holes 227a, 227c of different depth can be obtained by exposing the resin to laser radiation of different intensities.

Figure 8B:
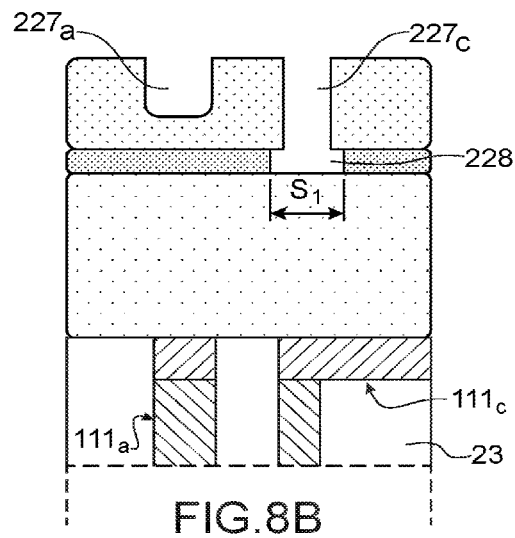

Then isotropic etching of the hard mask 224 exposed by the second hole 227c is carried out in order to extend the second hole 227c into the hard mask 224, and obtain a second hole 227c which has a widened bottom 228 of transverse cross-section greater than S2, where the bottom cross-section is preferably substantially equal to S1 (FIG. 8B).

This etching may be carried out for example using CH F$_3$ in a case where the hard mask 224 is made of silicon nitride or for example using SF$_6$ in a case where the hard mask 224 is made of polysilicon or polySiGe.

Figure 8C:
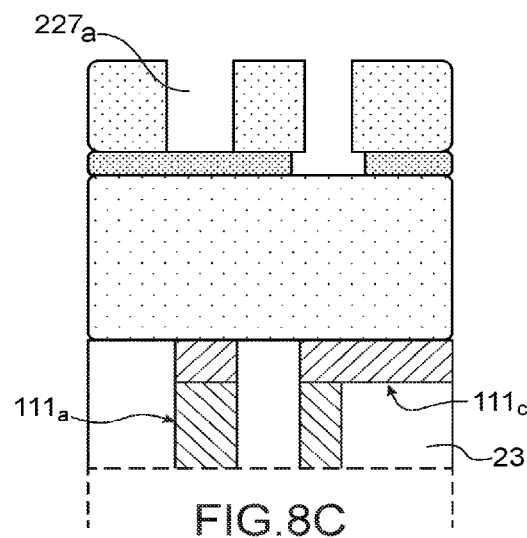
Figure 8D:
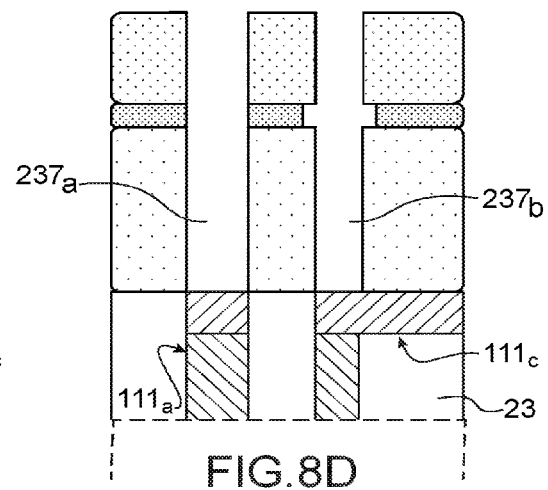

Then the first hole 227a is extended to the hard mask 224 (FIG. 8C). Anisotropic etching of the resin layer 225 is carried out to do this. This etching can be carried out for example using O$_2$ in order not to adversely affect the hard mask 224. The removal can be carried out without the use of a mask. In this case an upper portion of the resin layer 225 is removed at the same time. Prior to this removal the total thickness of the resin layer 225 will then initially have been sufficient to allow that after extension of the first hole 227a to the hard mask 224, a thickness of resin 225 remains.

Then anisotropic etching of the insulating layer 223 (FIG. 8D) is carried out. This etching leads to the formation of a first hole 237a of transverse cross-section S1 passing through the hard mask 224 and the insulating layer 223 and of a second hole 237b of cross-section S2 in the insulating layer 223.

Figure 8E:
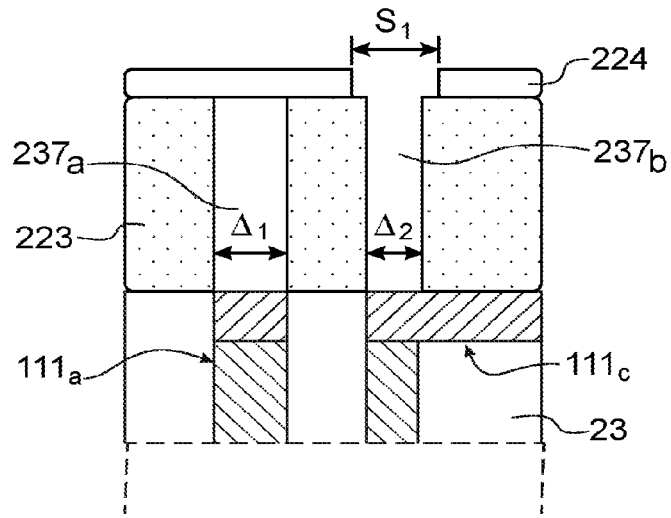

The resin layer 225 is then removed (FIG. 8E).

Then anisotropic etching of the insulating layer 223 is carried out so as to form in the insulating layer 223 a widened opening of transverse cross-section S1 for the second hole 237b.

Figure 8F:
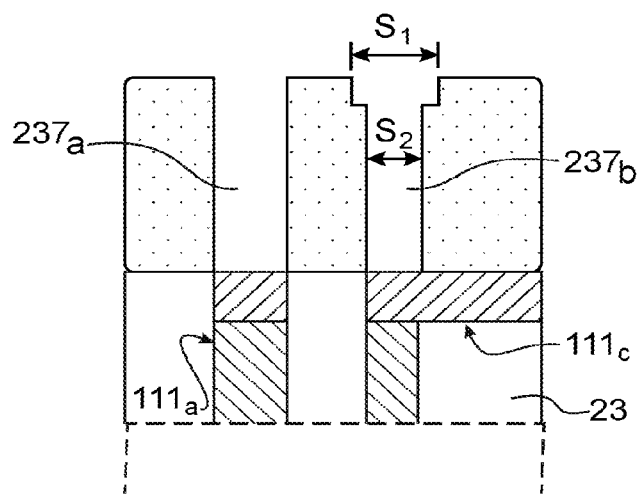

Then the layer of hard mask 224 is removed (FIG. 8F).

Figure 8G:
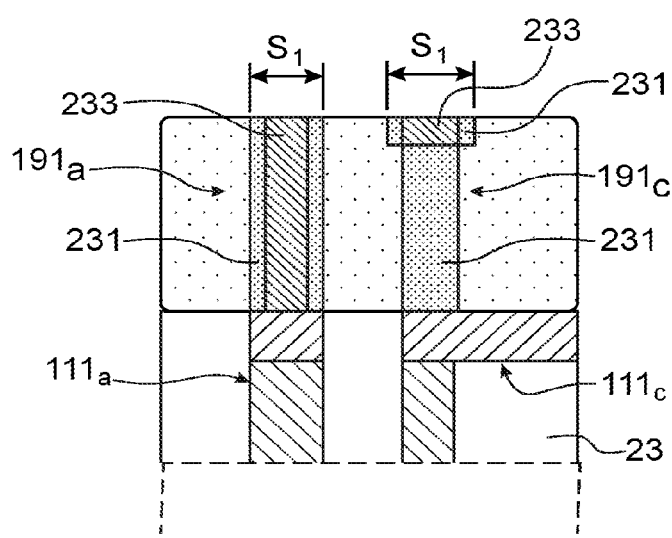

Then an envelope based on dielectric material 231 is formed in the holes 237a, 237b. This is, for example, a silicon oxide of the TeOs type or of silicon nitride by conforming deposition in the first hole 227a and the second hole 227c. Then anisotropic etching of this material 231 is carried out and the holes 237a, 237b are filled with a conducting material 233 such as, for example, tungsten (FIG. 8G).

As a result of the configuration of the dielectric material 231 and of the conducting material 233 in the hole 237a, an upper portion 191a is formed for the plug 135a which comprises a conducting rod surrounded by an insulating envelope. This upper portion 191a makes contact with the lower conducting portion 111a and establishes electrical continuity between an element in contact with this lower conducting portion 111a and another element in contact with this upper conducting portion 191a.

A different layout of the dielectric materials 231 and of the conducting material 223 in the hole 237c allows an upper portion 191c of the plug 135c to be configured so as to electrically isolate an element which makes contact with this upper portion 191a and the lower conducting portion 111c of this plug 135c. In the examples that have just been described the upper portions 191a, 191c of plugs 135a, 135c are provided with equal respective cross sections in order to be able to subsequently define an active zone 41a which extends sufficiently beyond, preferably symmetrically, either side of the channel region.

The method examples have been described above with two transistor levels.

A method according to the invention can also be applied to a stack of more than two transistors. Thus a method according to the invention can be applied to the use of an active zone of a transistor in a k+1-th level (where k>1) of transistors by making use of the layout of plugs made on a transistor in a k-th level of transistors.

The invention claimed is:

1. A method for manufacturing an integrated circuit equipped with at least two levels of superimposed transistors, comprising:
the creation of a plurality of plugs including at least one first plug, a second plug and a third plug on a drain region, a gate and a source region respectively of a first transistor of a first level of transistor(s), the first plug, the second plug and the third plug passing through an insulating layer covering the first transistor and being arranged such that the first plug is spaced apart from the third plug by a distance of at least d$_2$, the second plug is spaced apart from the first plug and from the third plug by a distance of at least d$_1$, where d$_1$ and d$_2$ are planned such that d$_1$>d$_2$,
forming a sacrificial support layer of thickness equal to h on the insulating later,
forming, on the sacrificial support layer, a semi-conducting layer capable of receiving at least one channel region of a second transistor of a second level of transistor(s), where the semi-conducting layer is arranged at an end of the plugs at a height h measured between an upper face of the insulating layer covering the first transistor and a lower face of the semi-conducting layer such that h>d$_1$,
removing the sacrificial layer so as to form a cavity of height h formed between the semi-conducting layer and the insulating layer,
forming a protective block in a first region of a cavity made between the insulating layer and the semi-conducting layer, where the first region is located facing the first transistor between the first plug and the third plug, the formation of the protective block comprising steps of conforming deposition of a sacrificial material in the cavity, then partial removal of the sacrificial material by isotropic etching in such a way as to preserve a block of sacrificial material between the first plug and the third plug at the end of the isotropic etching, where an active zone of the second transistor is intended to be defined facing the first plug the third plug and the protective block,
wherein the protective block is formed furthermore of a gate dielectric layer deposited before the sacrificial material and in which the formation of the protective block comprises furthermore, after deposition of the sacrificial material and isotropic etching of the sacrificial material, the partial removal of the gate dielectric layer in the cavity, where the dielectric layer is preserved in the first region, the method furthermore comprising after definition of the active zone, steps for:
removing the sacrificial material in the first region then, formation of a gate material in the cavity by conforming deposition in the cavity,
partial removal of the gate material in the cavity by isotropic etching so as to preserve the gate material in the first region.

2. The method according to claim 1, furthermore comprising, after formation of the protective block, at least one step for definition of the active zone of the second transistor, this definition comprising oxidation of the zones in the semi-conducting layer which are protected neither by the protective block nor by the plugs.

3. The method according to claim 1, furthermore comprising, after formation of the protective block, at least one step for definition of the active zone of the second transistor, wherein the definition of the active zone of the second transistor comprises etching of the zones in the semiconducting layer which are protected neither by the protective block nor by the plugs.

4. The method according to claim 1, wherein one or more plugs are formed of a conducting rod coated with an insulating envelope, the method furthermore comprising between after removal of the sacrificial material and prior to the formation of a gate material in the cavity, a step for removal of a portion of the insulating envelope coating, the plugs, so as to expose a portion of conducting rod.

5. The method according to claim 1, wherein the gate material is formed so as to fill in another region between the first region and the second plug, where the isotropic etching of the gate material is carried out so as to partially remove the gate material, where the gate material is preserved in this other region.

6. The method according to claim 1, wherein amongst the first plug, the second plug, and the third plug, at least one given plug comprises a lower conducting portion connected to the first transistor, and at least one upper portion based on an insulating material and configured so as to create insulation between the lower portion and the second transistor.

7. The method according to claim 6, wherein the given plug is the third plug and is connected to the source region of the first transistor.

8. The method according to claim 6, wherein the lower conducting portion is formed of conducting zones which form an elbow.

9. The method according to claim 7, wherein amongst the first plug, the second plug, and the third plug, at least one other plug comprises a lower conducting portion connected to the first transistor, and an upper conducting portion connected to the lower portion and to the second transistor.

10. The method according to claim 9, wherein the formation of the given plug and of the other plug comprise steps for:
formation of a layer and in this layer of a first hole and of a second hole, the first hole and second hole exposing respectively a lower conducting portion of the other plug and the lower conducting portion of the given plug, the first hole having a first transverse cross-section S1 greater than a second cross-section S2 of the second hole,
filling of the second hole using a filler material,
formation of a conducting rod coated with an insulating envelope in the first hole,
removal of the filler material in the second hole,
formation of an insulating material in the second hole.

11. The method according to claim 10, wherein after formation of the conducting rod and of the insulating envelope in the first hole, and prior to the removal of the filler material in the second hole, the second hole is widened so that the second hole has a transverse cross-section which is equal or substantially equal to the first cross section S1.

12. The method according to claim 11, wherein the formation of the given plug and of the other plug comprises steps for:
formation, on the lower respective conducting portions of the other plug and of the given plug, of an insulating layer and of a first hole and of a second hole in this insulating layer, the first and second hole exposing respectively the lower conducting portion of the other plug and the lower conducting portion of the given plug, the first hole having a first transverse cross-section S1 the second hole being formed of a part which has a second transverse cross-section S2<S1, opening out onto an end of cross-section equal or substantially equal to S1,
deposition in the first hole and the second hole of an insulating material,
etching of the insulating material so as to expose the bottom of the first hole whilst preserving an insulating envelope on the side walls of the first hole and preserving an insulating zone at the bottom of the second hole,
deposition of a conducting material.

13. The method according to claim 1, wherein the first transistor and the second transistor are arranged so as to form an inverter.

14. A method for manufacturing an integrated circuit equipped with at least two levels of superimposed transistors, comprising:
forming a first transistor of a first level of transistor(s) and covering said first transistor by an insulating layer,
forming a sacrificial support layer of thickness equal to h situated on said insulating layer,
forming a plurality of plugs including at least one first plug, a second plug and a third plug on a drain region, a gate and a source region respectively of a first transistor of a first level of transistor(s), the first plug, the second plug and the third plug passing through said sacrificial support and said insulating layer, said plugs being arranged such that the first plug is spaced apart from the third plug by a distance of at least d2, the second plug is spaced apart from the first plug and from the third plug by a distance of at least d1, where $d_1$ and $d_2$ are planned such that $d_1 > d_2$,
forming, on said sacrificial support layer, a semi-conducting layer capable of receiving at least one channel region of a second transistor of a second level of transistor(s), where the semi-conducting layer is arranged at an end of the plugs at a height h measured between an upper face of the insulating layer covering the first transistor and a lower face of the semi-conducting layer such that $h > d_1$,
removing the sacrificial layer so as to form a cavity of height h formed between the semi-conducting layer and the insulating layer,
forming a protective block in a first region of said cavity formed between the insulating layer and the semi-conducting layer, wherein the first region is located facing the first transistor between the first plug and the third plug, the foimation of the protective block comprising steps of conforming deposition of a sacrificial material in the cavity, then partial removal of the sacrificial material by isotropic etching in such a way as to preserve a block of sacrificial material between the first plug and the third plug at the end of the isotropic etching, where an active zone of the second transistor is intended to be defined facing the first plug the third plug and the protective block,
replacing said protective block by a transistor gate for the second transistor.

15. A method for manufacturing an integrated circuit equipped with at least two levels of superimposed transistors, comprising steps consisting of:
creating a plurality of plugs including at least one first plug, a second plug and a third plug on a drain region, a gate and a source region respectively of a first transistor of a first level of transistor(s), the first plug, the second plug and the third plug passing through an insulating layer covering the first transistor and passing through a sacrificial support layer of thickness equal to h on the insulating later, said plugs being arranged such that the first plug is spaced apart from the third plug by a distance of at least $d_2$, the second plug is spaced apart from the first plug and from the third plug by a distance of at least $d_1$, where $d_1$ and $d_2$ are planned such that $d_1 > d_2$, wherein amongst the first plug, the second plug, and the third plug, at least one given plug comprises a lower conducting portion and at least an upper portion, said lower portion passing through said insulating layer and being connected to the first transistor, said upper portion being based on an insulating material and configured so as to create insulation between the lower portion and the second transistor, said upper portion passing through said sacrificial support layer forming, on the sacrificial support layer, a semi-conducting layer capable of receiving at least one channel region of a second transistor of a second level of transistor(s), where the semi-conducting layer is arranged at an end of the upper portion of the plugs at a height h measured between an upper face of the insulating layer covering the first transistor and a lower face of the semi-conducting layer such that $h > d_1$, removing the sacrificial layer so as to form a cavity of height h formed between the semi-conducting layer and the insulating layer, forming a protective block in a first region of a cavity made between the insulating layer and the semi-conducting layer, where the first layer is located facing the first transistor between the first plug and the third plug, the formation of the protective block comprising steps of conforming deposition of a sacrificial material in the cavity, then partial removal of the sacrificial material by isotropic etching in such a way as to preserve a block of sacrificial material between the first plug and the third plug at the end of the isotropic etching, where an active zone of the second transistor is intended to be defined facing the first plug the third plug and the protective block.

16. The method according to claim 15, wherein the given plug is the third plug and is connected to the source region of the first transistor.

17. The method according to claim 15, wherein the lower conducting portion is formed of conducting zones which form an elbow.

18. The method according to claim 15, wherein the formation of the given plug and of the other plug comprise steps for:

formation of a layer and in this layer of a first hole and of a second hole, the first hole and second hole exposing respectively a lower conducting portion of the other plug and the lower conducting portion of the given plug, the first hole having a first transverse cross-section S1 greater than a second cross-section S2 of the second hole, filling of the second hole using a filler material, formation of a conducting rod coated with an insulating envelope in the first hole, removal of the filler material in the second hole, formation of an insulating material in the second hole.

* * * * *